United States Patent
Nakamura

(10) Patent No.: US 7,206,713 B2
(45) Date of Patent: Apr. 17, 2007

(54) METHOD OF ADJUSTING STROBE TIMING AND FUNCTION TESTING DEVICE FOR SEMICONDUCTOR DEVICE

(75) Inventor: Koji Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 184 days.

(21) Appl. No.: 10/942,017

(22) Filed: Sep. 16, 2004

(65) Prior Publication Data

US 2005/0080582 A1 Apr. 14, 2005

(30) Foreign Application Priority Data

Oct. 9, 2003 (JP) .............................. 2003-350402

(51) Int. Cl.
*G06F 19/00* (2006.01)
(52) U.S. Cl. ....................................... 702/125; 324/765
(58) Field of Classification Search .................. 702/58, 702/69, 79, 81–82, 124–125, 182, 185; 714/25, 714/37, 48, 55, 700; 324/765
See application file for complete search history.

(56) References Cited

U.S. PATENT DOCUMENTS

| | | | | |
|---|---|---|---|---|
| 5,633,879 A | * | 5/1997 | Potts et al. ................. 714/738 |
| 5,659,553 A | * | 8/1997 | Suzuki ......................... 714/736 |
| 6,532,561 B1 | * | 3/2003 | Turnquist et al. ........... 714/738 |
| 6,609,077 B1 | * | 8/2003 | Brown et al. ................ 702/117 |
| 7,010,729 B2 | * | 3/2006 | Doi et al. .................... 714/700 |
| 2001/0007972 A1 | * | 7/2001 | Araki et al. .................. 703/16 |
| 2004/0216005 A1 | * | 10/2004 | Pramanick et al. ........... 714/30 |

FOREIGN PATENT DOCUMENTS

JP     7244133     9/1995

* cited by examiner

*Primary Examiner*—Marc S. Hoff
*Assistant Examiner*—Mary Catherine Baran
(74) *Attorney, Agent, or Firm*—Takeuchi & Kubotera, LLP

(57) ABSTRACT

A method of adjusting a strobe timing includes a first determining step in which an output pattern is compared with an expected result pattern at a strobe timing to determine whether the output pattern is matched to the expected result pattern; a variation range setting step in which a variation range of the strobe timing is set when the output pattern is not matched to the expected result pattern; a varying step in which the strobe timing is varied within the variation range; and a second determining step in which the output pattern is compared with the expected result pattern at the varied strobe timing to determine whether the output pattern is matched to the expected result pattern. Based on a result of the comparison, a function test is performed using the strobe timing to determine a pass/fail result of the semiconductor.

2 Claims, 4 Drawing Sheets

METHOD OF ADJUSTING STROBE TIMING AND FUNCTION TESTING DEVICE FOR SEMICONDUCTOR DEVICE

BACKGROUND OF THE INVENTION AND RELATED ART STATEMENT

The present invention relates to a method of adjusting a strobe timing in a function test for a semiconductor device and a function testing device for a semiconductor device.

Conventionally, various techniques related to a function testing device for a semiconductor device have been developed. For example, in a testing device disclosed in Japanese Patent Publication No. 07-244133, an input signal generating device 2 sends an input signal to a device to be tested 1, and an obtained output signal is compared in determining means 4 with determination information from a setting unit 5, so that pass/fail of the device is determined. In determining pass/fail, a pattern of the output signal is compared with a pattern of the determination information at a specific timing (strobe timing). The strobe timing, at which the patterns are compared, is generally adjusted manually.

When a plurality of different functions of a semiconductor device is tested, it is necessary to manually adjust the strobe timing for a test of each of the functions. When a plurality of semiconductor devices has a variation in a specific function, if the function test is performed for a semiconductor device at a fixed strobe timing, it is possible that some of the semiconductor devices are determined to be good (pass), and others are determined to be defective (fail). That is, semiconductors devices, which can be good if tested at a proper strobe timing, might be determined to be defective, thereby deteriorating yield.

In view of the problem described above, an object of the present invention is to provide a method of automatically setting a proper strobe timing for the function test of a semiconductor device.

SUMMARY OF THE INVENTION

In order to attain the object described above, in a method of adjusting a strobe timing according to the present invention, a test pattern is input to a semiconductor device, and an output pattern output from the semiconductor device is compared with an expected result pattern at a specific strobe timing. Based on a result of the comparison, a function test is performed using the strobe timing to determine a pass/fail result of the semiconductor device. The method includes a first determining step in which the output pattern is compared with the expected result pattern at the strobe timing to determine whether the output pattern is matched to the expected result pattern; a variation range setting step in which a variation range of the strobe timing is set when it is determined that the output pattern is not matched to the expected result pattern; a varying step in which the strobe timing is varied within the variation range; and a second determining step in which the output pattern is compared with the expected result pattern at the varied strobe timing to determine whether the output pattern is matched to the expected result pattern.

According to the present invention, when the output pattern is compared with the expected result pattern at a specific strobe timing (for example, an arbitrary default timing) and they are not matched, the strobe timing is varied within a predetermined range. Then, the output pattern is compared with the expected result pattern at the varied strobe timing to determine whether they are matched. Therefore, even if they are not matched at a specific strobe timing, the semiconductor device is not immediately determined as a failure. When they are compared at the varied strobe timing and matched, the semiconductor device can pass the test. Accordingly, when the semiconductor device is determined to pass or fail based on the result of the comparison, a semiconductor device, which can be good if tested at a proper strobe timing, is less likely to be determined as defective, thereby improving yield. Further, the range for varying the strobe timing is set, so that the strobe timing is varied automatically, thereby eliminating manual adjustment of the strobe timing and shortening test time.

According to the present invention, a function testing device for a semiconductor device includes test pattern inputting means for inputting a test pattern to the semiconductor device; expected result pattern outputting means for outputting an expected result pattern corresponding to the test pattern; and pass/fail determining means for comparing an output pattern from the semiconductor device upon receipt of the test pattern with the expected result pattern at a specific strobe timing to determine whether the output pattern is matched to the expected result pattern. When it is determined that the output pattern is not matched to the expected result pattern, a range for varying the strobe timing is set. After the strobe timing is varied within the range, the output pattern is compared with the expected result pattern at the varied strobe timing to determine whether the output pattern is matched to the expected result pattern. When it is determined that the output pattern is not matched to the expected result pattern, the varied strobe timing is stored. These steps of varying, determining, and storing are repeated until the strobe timing varies from the lower limit to the upper limit of the range. When it is determined that the output pattern is matched to the expected result pattern in any one of the steps of determining, the semiconductor device is determined to pass the function test. When it is determined that the output pattern is not matched to the expected result pattern in any one of the steps of determining, the semiconductor device is determined to fail the function test.

According to the present invention, even if the output pattern is not matched to the expected result pattern at a specific strobe timing, the semiconductor device is not immediately determined as a failure. When they are compared at the varied strobe timing and matched, the semiconductor device can pass the test. Accordingly, a semiconductor device, which can be good if tested at a proper strobe timing, is less likely to be determined as defective, thereby improving yield.

According to the present invention, when the output pattern is not matched to the expected result pattern at a specific strobe timing, the strobe timing is varied within a predetermined range. Then, the output pattern is compared with the expected result pattern at the varied strobe timing to determine whether they are matched. Therefore, even if they are not matched at a specific strobe timing, the semiconductor device is not immediately determined as a failure. When they are compared at the varied strobe timing and matched, the semiconductor device can pass the test.

When the semiconductor device is determined to pass or fail based on the result of the comparison, a semiconductor device, which can be good if tested at a proper strobe timing, is less likely to be determined as defective, thereby improving yield. Further, the range for varying the strobe timing is set, so that the strobe timing is varied automatically, thereby eliminating manual adjustment of the strobe timing and shortening test time.

DETAILED DESCRIPTION OF PREFERRED EMBODIMENT

Figure 1:
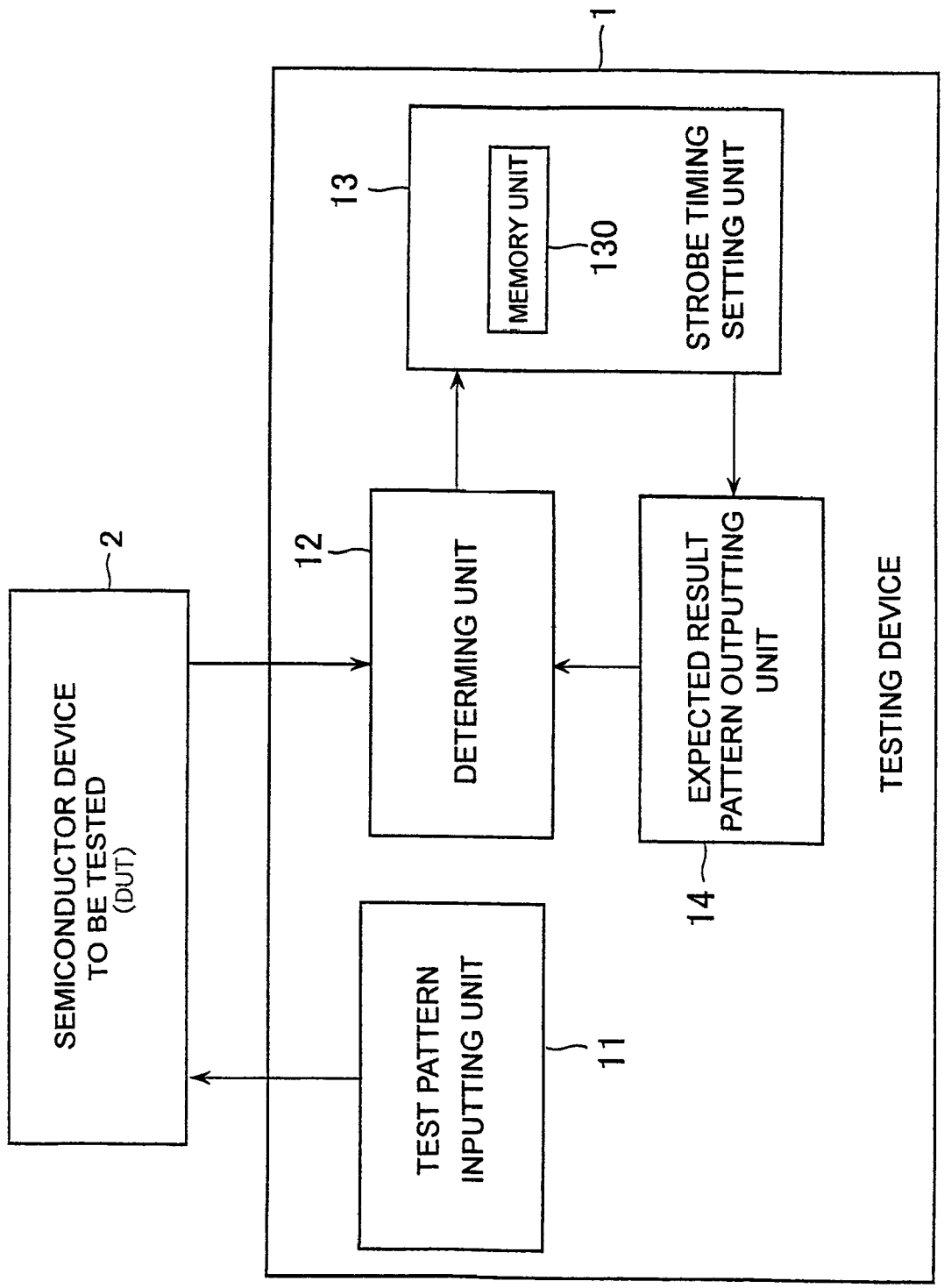
FIG. 1 is a block diagram showing a testing device according to an embodiment of the present invention.

Hereunder, embodiments of the present invention will be described with reference to the accompanying drawings. FIG. 1 is a block diagram showing a testing device 1 according to an embodiment of the present invention. The testing device 1 includes a test pattern input unit 11, a determining unit 12, a strobe timing setting unit 13, and an expected result pattern output unit 14. The test pattern input unit 11 inputs a specific test pattern to a semiconductor device to be tested (DUT) 2. The test pattern may be changed for every function test (test) to be executed, or may be a constant pattern. For example, it is possible to input test patterns Pn (n=1, 2, . . . ) for each of n types of tests. In the present embodiment, the number of the tests is three (n=3), and they are designated as Test 1, Test 2 and Test 3. The corresponding input patterns are designated as P1, P2 and P3.

Figure 2:
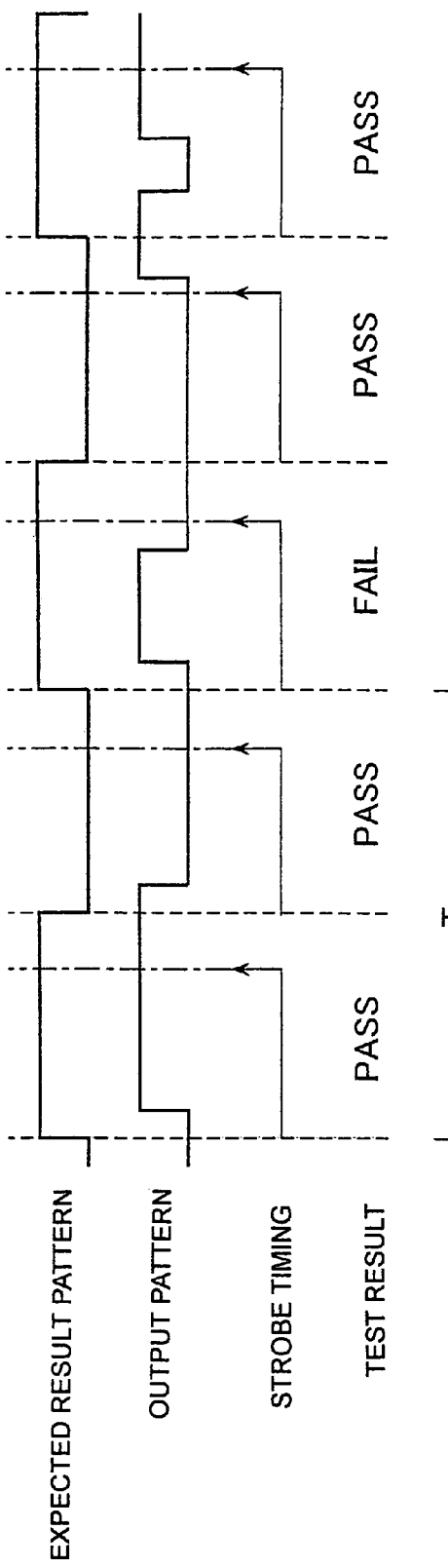
FIG. 2 is a chart showing a pattern of an expected result, a pattern of an output, a strobe timing and a test result.

The expected result pattern output unit 14 outputs En, i.e., an expected pattern to be output corresponding to the input test pattern Pn when DUT2 works normally, to the determining unit 12. In the determining unit 12, as shown in FIG. 2, an output pattern On output from the determining unit 12 upon the input of the test pattern is compared with the expected result pattern En at a specific timing, i.e., a strobe timing, set by the strobe timing setting unit 13, so that it is determined that the two patterns are matched. The strobe timing setting unit 13 set the strobe timing with a specific testing process (described later). That is, the testing device of the embodiment sets the strobe timing automatically, thereby eliminating manual setting of the strobe timing. Incidentally, the number of the types of tests is not limited to three, and may be another natural number.

Figure 3:
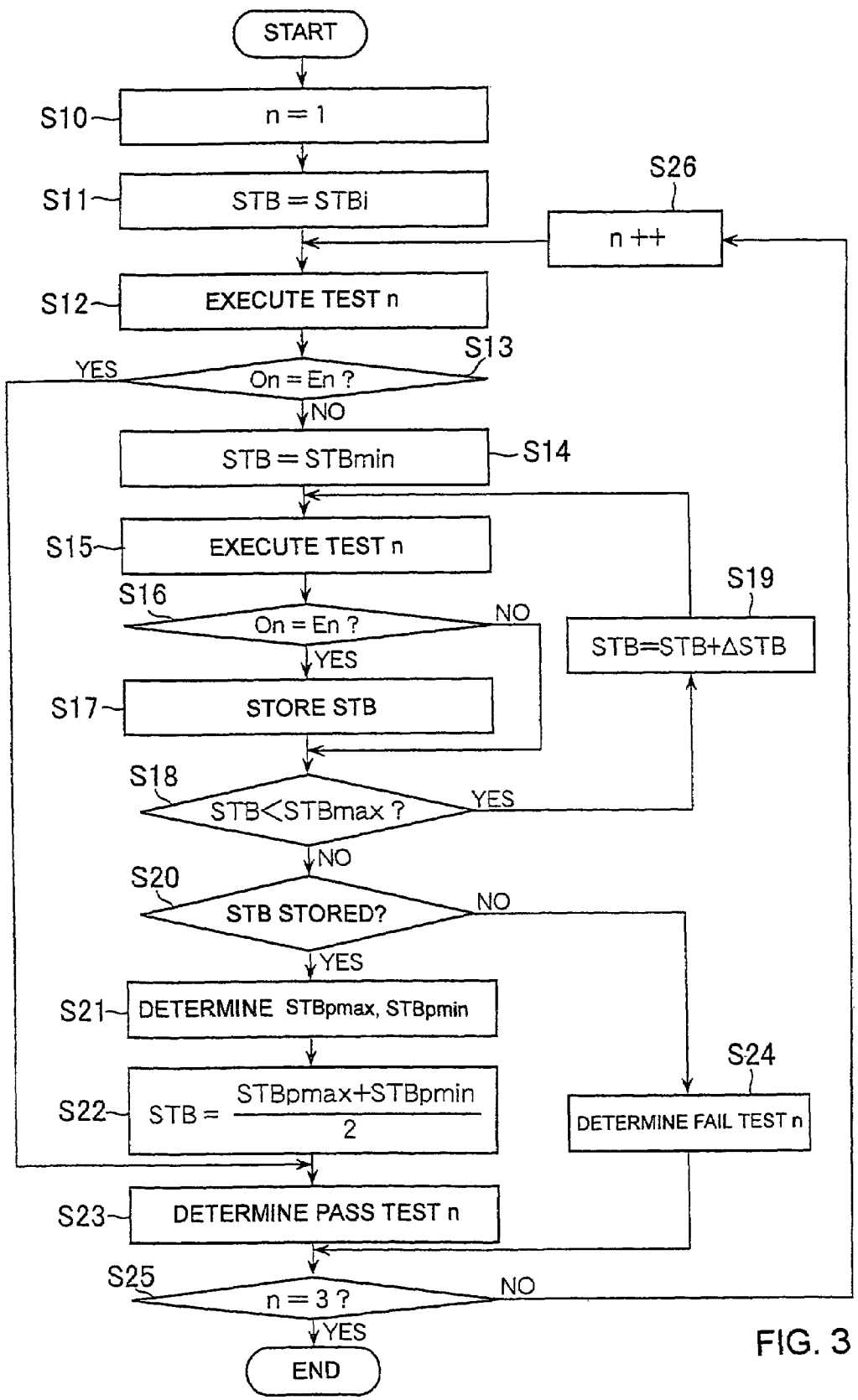
FIG. 3 is a flowchart showing a process of test according to an embodiment of the present invention.

With reference to a flowchart shown in FIG. 3, a flow of testing process will be explained next. In the process, it is assumed that a plurality of n tests is performed for one DUT2, and a strobe timing for the (n+1) test to be performed next is determined based on a result of tests that have been already done. The process may start at a specific time, or upon an instruction of a user.

In S10, a variable n representing a type of test is set to be 1 (n=1). In S11, the strobe timing setting unit 13 set a strobe timing STB relative to the determining unit 12 to be STBi (STB=STBi). STBi is an arbitrary number, for example, 1/10 of a cycle T (see FIG. 2) of an expected result pattern E1 (every timing per T/10 after the first cycle of the test pattern Pn starts). In S12, the test pattern input unit 11 inputs the test pattern Pn to DUT2. In S13, the determining unit 12 compares the expected result pattern En with the output pattern On at the strobe timing STB to determine if the patterns are matched. If the patterns are matched, the testing process proceeds to S13, and if the patterns are not matched, the testing process proceeds to S14.

In S14, the strobe timing setting unit 13 sets the strobe timing relative to the determining unit 12 to be STBmin (STB=STBmin). STBmin is an arbitrary number, for example, STBmin=0 (same timing when a cycle of the test pattern Pn starts). In S15, the test pattern input unit 11 inputs the test pattern Pn to DUT2. In S16, the determining unit 12 compares the expected result pattern En with the output pattern On at the strobe timing STB to determine if the patterns are matched. If the patterns are matched, the testing process proceeds to S17, and if the patterns are not matched, the testing process proceeds to S18. In S17, the strobe timing setting unit 13 stores the strobe timing currently set in a memory unit 130.

In S18, the strobe timing setting unit 13 determines if the strobe timing STB is smaller than STBmax (STB<STBmax). STBmax is an arbitrary number larger than STBmin, for example, double of the cycle T of the expected result pattern En (at a timing per 2T after the first cycle of the test pattern Pn starts). If STB is smaller than STBmax (STB<STBmax), the testing process proceeds to S19, and if STB is equal to or greater than STBmax (STB≧STBmax), the testing process proceeds to S20. In S19, the strobe timing setting unit 13 adds a specific increment ΔSTB to the current strobe timing STB, and sets the sum (STB+ΔSTB) as a new strobe timing. Then, the testing process returns to S15. ΔSTB may be an arbitrary number, and may be a maximum number of repetition in which S15 to S18 are repeated. For example, when ΔSTB=(STBmax−STBmin)/m (m=1, 2, 3 . . . ), S15 to S18 are repeated m times. Accordingly, when m is set at a small number, it is possible to shorten the test time as a large number of repetitions are avoided.

In S20, the strobe timing setting unit 13 determines whether the memory unit 130 stores at least one strobe timing. If the strobe timing is stored, the testing process proceeds to S21, and if the strobe timing is not stored, the testing process proceeds to S24. In S21, the strobe timing setting unit 13 determines the largest STBpmax and the smallest STBpmin among the strobe timings stored in the memory unit 130, and STBpmax and STBpmin are stored in the memory unit 130. In S22, the strobe timing setting unit 13 sets an average of STBpmax and STBpmin as a new strobe timing STB.

In S23, the determining unit 12 sends a signal (pass signal) indicating a pass test result of DUT2 to a specific device (printer, display and so on). In S24, the determining unit 12 sends a signal (fail signal) indicating a fail test result of DUT2 to the specific device. In S25, the strobe timing setting unit 13 determines that S12 to S24 are executed for all types of test, i.e. whether n is equal to 3 (n=3). If n is equal to 3, the testing process is stopped. If n is less than 3, 1 is added to n in S26, and the testing process returns to S12.

As described above, when it is determined that the output pattern On is not equal to En (On≠En, no in S13) in the test n executed for DUT2, the strobe timing STB is increased from STBmin to STBmax with the increment of ΔSTB, and the test n is executed with the increased strobe timing STB (S15). When it is determined that the output pattern On is equal to En (On=En, yes in S16), the strobe timing at that time is sequentially stored. That is, when DUT2 is determined as On≠En in the test n, the strobe timing STB of the next test n+1 is automatically adjusted to be within STBpmax and STBpmin of the strobe timing STB of the test n in which DUT2 is determined as On=En. Accordingly, it is not necessary to adjust the strobe timing manually, thereby shortening the test time. Further, when it is determined that On=En in S13, the strobe timing STB is not changed, that is the strobe timing is shared for different tests. Accordingly, it is not necessary to set the strobe timing in the determining unit 12 every time executing a different test, thereby shortening the test time.

Even if the output pattern On is not matched to the expected result pattern En with the strobe timing (no in S13), DUT2 is not immediately determined as fail in the test n. After the strobe timing is adjusted, if they are matched (On=En, yes in S16 and S20), DUT2 is determined to be pass. After the strobe timing is adjusted, if they are not matched even once (On≠En, no in S20), DUT2 is finally determined as fail (S24). Accordingly, DUT2, which can be good if tested at a proper strobe timing, is less likely to be determined as defective due to an improper strobe timing, thereby improving yield.

Figure 4:
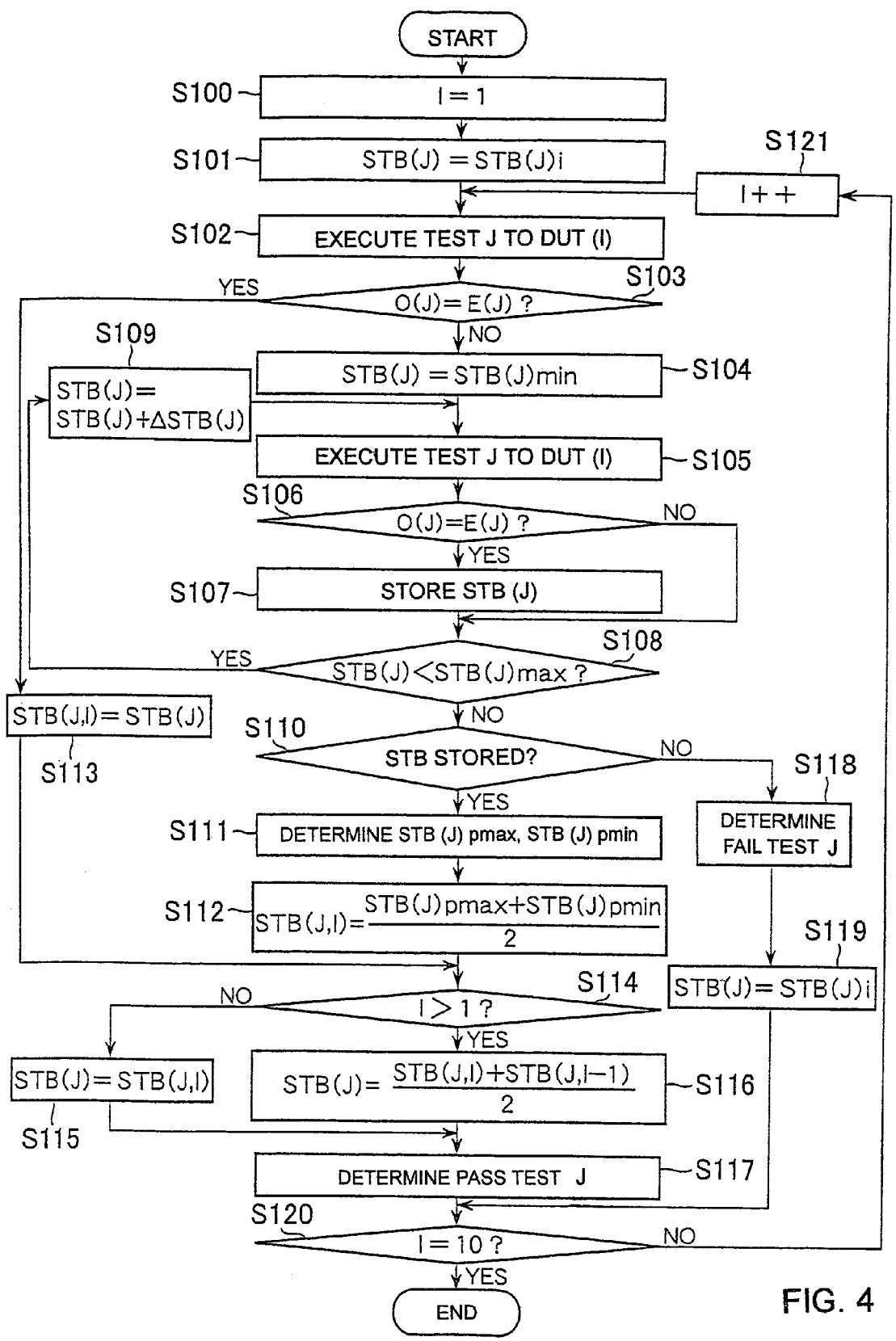
FIG. 4 is a flowchart showing a process of test according to an embodiment of the present invention.

FIG. 4 is a flowchart showing a testing process according to another embodiment of the present invention. In this embodiment, different from the previous embodiment, one test J is executed for one or a plurality of DUT2s, i.e., DUT(l) (l=1, 2, 3 . . . ). According to a result of the test, a strobe timing STB(J) of the test J is set for the next DUT2, i.e., DUT(l+1). This process may starts after a specific period of time or upon an instruction of a user. For the sake of explanation, it is assumed that the test is sequentially executed for ten DUT2s, i.e., DUT(1) to DUT(10), and the number l of DUT2s is not limited thereto.

In S100, the variable l indicating an order of DUT2 in the test J is set to be 1 (l=1). In S101, the strobe timing setting unit 13 sets the strobe timing STB(J) equal to STB(J)i (STB(J)=STB(J)i) relative to the determining unit 12. STB (J)i is an arbitrary number, for example, ¹⁄₁₀ of a cycle T(J) of the expected result pattern E(J) of the test J (every timing per T/10 after the first cycle of the test pattern P(J) starts). In S102, the test pattern input unit 11 inputs the test pattern P(J) to DUT(1). In S103, the determining unit 12 compares the expected result pattern E(J) corresponding to the test pattern P(J) with the output pattern O(J) output from DUT (1) at the strobe timing STB(J) to determine if the expected result pattern E(J) is matched to the output pattern O(J). If the patterns are matched, the testing process proceeds to S113, and if the patterns are not matched, the testing process proceeds to S104.

In S104, the strobe timing setting unit 13 sets the strobe timing STB(J) relative to the determining unit 12 to be STB(J)min (STB(J)=STB(J)min). STB(J)min is an arbitrary number, for example, STBmin=0 (same timing when a cycle of the test pattern P(J) starts). In S105, the test pattern input unit 11 inputs the test pattern P(J) to DUT2. In S106, the determining unit 12 compares the expected result pattern E(J) corresponding to the test pattern P(J) with the output pattern O(J) at the strobe timing STB(J) to determine if the patterns are matched. If the patterns are matched, the testing process proceeds to S107, and if the patterns are not matched, the testing process proceeds to S108. In S107, the strobe timing setting unit 13 stores the strobe timing STB(J) currently set in the memory unit 130.

In S108, the strobe timing setting unit 13 determines if the strobe timing STB(J) is-smaller than STB(J)max (STB(J) <STB(J)max). STB(J)max is an arbitrary number larger than STB(J)min, for example, double of the cycle T(J) of the expected result pattern E(J) (at a timing per 2T after the first cycle of the test pattern P(J) starts). If STB(J) is smaller than STB(J)max (STB(J)<STB(J)max), the testing process proceeds to S109, and if STB(J) is equal to or greater than STB(J)max (STB(J)≧STB(J)max), the testing process proceeds to S110. In S109, the strobe timing setting unit 13 adds a specific increment ΔSTB(J) to the current strobe timing STB(J), and sets the sum (STB(J)+ΔSTB(J)) as a new strobe timing STB(J). Then, the testing process returns to S105. ΔSTB(J) may be an arbitrary number, and may be a maximum number of repetitions in which S105 to S109 are repeated. For example, when ΔSTB(J)=(STB(J)max−STB (J)min)/m (m=1, 2, 3 . . . ), S105 to S109 are repeated m times.

In S110, the strobe timing setting unit 13 determines whether the memory unit 130 stores at least one strobe timing. If the strobe timing is stored, the testing process proceeds to S111, and if the strobe timing is not stored, the testing process proceeds to S118. In S111, the strobe timing setting unit 13 determines the largest STB(J)pmax and the smallest STB(J)pmin among the strobe timings stored in the memory unit 130, and STB(J)pmax and STB(J)pmin are stored in the memory unit 130. In S112, the strobe timing setting unit 13 sets an average of STB(J)pmax and STB(J) pmin as a temporary strobe timing STB(J, 1). The temporary strobe timing STB(J, 1) is a temporary variable used in S116. In S113, the strobe timing setting unit 13 sets the current strobe timing STB(J) as the temporary strobe timing STB(J, 1).

In S114, the determining unit 12 determines whether l is greater than 1 (l>1). If l is equal to 1, the testing process proceeds to S115. If l is greater than 1, the testing process proceeds to S116. In S115, the strobe timing setting unit 13 sets the strobe timing STB(J) relative to the determining unit 12 to be the temporary strobe timing STB(J, 1). In S116, the strobe timing setting unit 13 sets an average of the temporary strobe timing STB(J, 1) and the temporary strobe timing STB(J, l−1) as the strobe timing STB(J).

In S117, the determining unit 12 sends a signal (pass signal) indicating a pass test result of DUT(l) to a specific device. In S118, the determining unit 12 sends a signal (fail signal) indicating a fail test result of DUT(l) to the specific device. In S119, the strobe timing setting unit 13 sets the strobe timing STB(J) relative to the determining unit 12 to be a strobe timing STB(J)i (STB(J)=STB(J)i). In S120, the strobe timing setting unit 13 determines that S102 to S119 are executed for all DUT2s, i.e. whether l is equal to 10 (l=10). If l is equal to 10, the testing process is stopped. If l is less than 10, the testing process proceeds to S121. In S121, 1 is added to l, and the testing process returns to S102.

As described above, when it is determined that the output pattern O(J) is not equal to E(J) (O(J)≠E(J), no in S103) in the test J executed for one or a plurality of DUT2s, the strobe timing STB(J) is increased from STB(J)min to STB(J)max with the increment of ΔSTB(J), and the test J is executed with the increased strobe timing STB(J) (S105). When it is determined that the output pattern O(J) is equal to E(J) (O(J)=E(J), yes in S106 and S110) in the test J executed with one of the strobe timings STB(J) changed within STB(J)max and STB(J)min, DUT(l) is determined to be good (S117). That is, when the output pattern O(J) is not matched to the expected result pattern E(J) with the strobe timing STB(J) (no in S103), DUT(l) is not immediately determined as failed in the test J. After the strobe timing is changed, if they are matched (O(J)=E(J)), DUT(l) is determined to be pass (S117). After the strobe timing is changed, if they are not matched even once (O(J)≠E(J), no in S110), DUT(l) is finally determined as failure (S118). Accordingly, DUT(l), which can be good if tested at a proper strobe timing, is less likely to be determined as defective due to an improper strobe timing, thereby improving yield.

The strobe timing in the case that it is determined that the output pattern O(J) is matched to the expected result pattern E(J), or the average of the temporary strobe timing STB(J, l−1) and STB(J, 1) is set as the strobe timing STB(J) of the test J for DUT(l+1). That is, even if the strobe timing in the case that the output pattern O(J) is matched to the expected result pattern E(J) is fluctuated between DUT(l−1) and DUT(l) due to a variation in property between DUT(l−1) and DUT(l), it is possible to execute the test J for DUT(l+1) using the average ((STB(J, l−1)+STB(J, l))/2), which is within a range between STB(J, l−1) and STB(J, l), as the new strobe timing. Accordingly, even if the semiconductor device DUT(l+1) has a further variation in property, there is an increased chance that O(J) is matched to E(J) (O(J)=E(J)), thereby improving yield.

What is claimed is:

1. A method of adjusting a strobe timing used for a function test wherein a test pattern is input to a semiconductor device, and an output pattern output from the semiconductor device is compared with an expected result pattern at the strobe timing to determine a pass/fail result of the semiconductor device, comprising the steps of:

a first step of setting a default value of the strobe timing;

a second step of comparing the output pattern output from the semiconductor device in response to the test pattern with the expected result pattern at the default value of the strobe timing;

a third step of setting an initial value of the strobe timing different from the default value set in the second step to a minimum value of the strobe timing in a variation range thereof when the output pattern is not matched to the expected result pattern;

a fourth step of comparing the output pattern in response to the test pattern with the expected result pattern at the strobe timing set in the third step, storing the strobe timing when the output pattern is matched to the expected result pattern, and determining whether the strobe timing exceeds a maximum value in the variation range;

a fifth step of increasing the initial value of the strobe timing set in the third step by a specific value when the strobe timing does not exceed the maximum value, and repeating the fourth step until the strobe timing exceeds the maximum value;

a sixth step of setting the default value of the strobe timing for a next test pattern based on the strobe timing stored in the fourth step, and for repeating a process from the second step; and a seventh step of calculating a new strobe timing according to the minimum value and the maximum value when there is the stored strobe timing so that the new strobe timing is used as the default value for the next test pattern.

2. A function testing apparatus for a semiconductor device, comprising:

test pattern inputting means for inputting a test pattern to the semiconductor device;

expected result pattern outputting means for outputting an expected result pattern corresponding to the test pattern; and pass/fail determining means for performing a first process of setting a default value of the strobe timing;

a second process of comparing the output pattern output from the semiconductor device in response to the test pattern with the expected result pattern at the default value of the strobe timing;

a third process of setting an initial value of the strobe timing different from the default value set in the second process to a minimum value of the strobe timing in a variation range thereof when the output pattern is not matched to the expected result pattern;

a fourth process of comparing the output pattern in response to the test pattern with the expected result pattern at the strobe timing set in the third process, storing the strobe timing when the output pattern is matched to the expected result pattern, and determining whether the strobe timing exceeds a maximum value in the variation range;

a fifth process of increasing the initial value of the strobe timing set in the third process by a specific value when the strobe timing does not exceed the maximum value, and repeating the fourth process until the strobe timing exceeds the maximum value;

a sixth process of setting the default value of the strobe timing for a next test pattern based on the strobe timing stored in the fourth step, and for repeating a process from the second process; and a seventh process of calculating a new strobe timing according to the minimum value and the maximum value when there is the stored strobe timing so that the new strobe timing is used as the default value for the next test pattern.

* * * * *